United States Patent
Miyanagi et al.

(10) Patent No.: US 9,601,404 B2
(45) Date of Patent: Mar. 21, 2017

(54) THERMAL RESISTANCE MEASURING METHOD AND THERMAL RESISTANCE MEASURING DEVICE

(71) Applicant: FUJI ELECTRIC CO., LTD., Kawasaki-shi (JP)

(72) Inventors: Toshiyuki Miyanagi, Azumino (JP); Yuichiro Hinata, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 468 days.

(21) Appl. No.: 14/302,206

(22) Filed: Jun. 11, 2014

(65) Prior Publication Data
US 2015/0003492 A1  Jan. 1, 2015

(30) Foreign Application Priority Data
Jun. 27, 2013 (JP) ................ 2013-134768

(51) Int. Cl.
*G01N 25/18* (2006.01)
*H01L 23/34* (2006.01)
(Continued)

(52) U.S. Cl.
CPC .......... *H01L 23/34* (2013.01); *G01R 31/2619* (2013.01); *G01R 31/2628* (2013.01); *H01L 23/3735* (2013.01); *H01L 2924/0002* (2013.01)

(58) Field of Classification Search
CPC .. H01L 2924/1306; G01K 7/08; G01N 25/18; G05F 3/16
See application file for complete search history.

(56) References Cited

U.S. PATENT DOCUMENTS 5,291,073 A * 3/1994 Lewandowski ........ G01R 21/02 324/106
8,785,931 B2 * 7/2014 Kinouchi .................. G01K 7/01 257/368
(Continued)

FOREIGN PATENT DOCUMENTS

JP      07-035813 A    2/1995
JP      11-211786 A    8/1999
(Continued)

*Primary Examiner* — Gail Kaplan Verbitsky
(74) *Attorney, Agent, or Firm* — Rossi, Kimms & McDowell LLP

(57) ABSTRACT

A temperature of a semiconductor element is measured based on a temperature coefficient of a voltage between the first electrode and the second electrode when no heat is generated when causing a constant current of an extent such that the semiconductor element does not generate heat to be input wherein current is caused to flow from a third electrode to a second electrode in accordance with voltage applied between a first electrode and the second electrode. Also, a constant current such that the semiconductor element generates heat is input into the third electrode, with voltage applied between the first electrode and second electrode of the semiconductor element kept constant, and power is measured based on the current such that the semiconductor element generates heat and on voltage when heat is generated between the third electrode and second electrode when the semiconductor element generates heat.

11 Claims, 8 Drawing Sheets

(51) Int. Cl.
*G01R 31/26* (2014.01)
*H01L 23/373* (2006.01)

(56) References Cited

U.S. PATENT DOCUMENTS

| | | | | |
|---|---|---|---|---|
| 2003/0038124 A1* | 2/2003 | Krieger | ............... | B60R 16/0238 |
| | | | | 219/209 |
| 2010/0150202 A1* | 6/2010 | Asano | .................... | G01K 7/346 |
| | | | | 374/44 |
| 2012/0081350 A1* | 4/2012 | Sano | ........................ | G09G 3/28 |
| | | | | 345/211 |
| 2013/0134882 A1* | 5/2013 | Nuhfer | ................. | H05B 33/089 |
| | | | | 315/119 |
| 2013/0153900 A1* | 6/2013 | Kinouchi | ................ | G01K 7/01 |
| | | | | 257/48 |
| 2014/0070319 A1* | 3/2014 | Tonomura | ........... | H01L 27/0211 |
| | | | | 257/355 |

FOREIGN PATENT DOCUMENTS

| | | | |
|---|---|---|---|
| JP | 2005268703 A * | 9/2005 | |
| JP | 2012-145354 A | 8/2012 | |
| JP | 5300446 B2 * | 9/2013 | |
| RU | 2121153 C1 * | 10/1998 | |
| RU | 2178893 C1 * | 1/2002 | |

* cited by examiner

US 9,601,404 B2

THERMAL RESISTANCE MEASURING METHOD AND THERMAL RESISTANCE MEASURING DEVICE

CROSS-REFERENCE TO RELATED APPLICATION

This application claims priority from and the benefit of Japanese Application No. 2013-134768, filed Jun. 27, 2013, the entire disclosure of which is incorporated herein by reference.

BACKGROUND

Field of the Invention

The present invention relates to a thermal resistance measuring method and thermal resistance measuring device.

Discussion of the Background

On a semiconductor device incorporated a semiconductor element, thermal resistance is measured in order to measure the heat dissipation capacity of the semiconductor device.

A ΔVgs method, whereby measurement is carried out by controlling gate voltage so that the power of the semiconductor element becomes constant (for example, refer to JP-A-2012-145354), a ΔVds method, whereby measurement is carried out by the gate voltage of the semiconductor element being kept constant (for example, refer to JP-A-11-211786), or the like, are utilized for measuring the thermal resistance of a semiconductor device when the semiconductor element is, for example, a metal-oxide semiconductor field effect transistor (MOSFET).

SUMMARY OF THE INVENTION

However, when measuring thermal resistance value using the ΔVgs method, the heat generation distribution within a MOSFET with particularly high channel resistance becomes localized when the MOSFET is caused to generate heat, it becomes necessary to estimate the size of the MOSFET on the small side, and a problem occurs in that it is not possible to appropriately carry out thermal resistance measuring.

Also, when measuring thermal resistance using the ΔVds method, the accuracy of a temperature coefficient is poor in the case of a MOSFET with particularly low on-state voltage, and a problem occurs in that it is not possible to appropriately carry out thermal resistance measuring.

Embodiments of the invention provide a thermal resistance measuring method and thermal resistance measuring device such that the accuracy of thermal resistance measuring is increased.

In order to resolve the heretofore described problems, an aspect of the invention provides a thermal resistance measuring method including a step of measuring the exterior temperature of a semiconductor device housing a semiconductor element wherein current is caused to flow from a third electrode to a second electrode in accordance with voltage applied between a first electrode and the second electrode, a step of inputting a constant current of an extent such that the semiconductor element does not generate heat, measuring a second voltage between the first electrode and second electrode of the semiconductor element, which is controlled so that a first voltage between the third electrode and second electrode of the semiconductor element is constant, and calculating the element temperature of the semiconductor element based on the second voltage and on a temperature coefficient relating to the second voltage, a step of causing a constant current such that the semiconductor element generates heat to be input between the third electrode and second electrode, with a third voltage applied between the first electrode and second electrode of the semiconductor element kept constant, a step of calculating a power based on the current such that the semiconductor element generates heat, and on a fourth voltage between the third electrode and second electrode when the semiconductor element generates heat, a step of inputting a constant current of an extent such that the semiconductor element does not generate heat, measuring a fifth voltage between the first electrode and second electrode of the semiconductor element, which is controlled so that the first voltage between the third electrode and second electrode of the semiconductor element is constant, and calculating the element temperature of the semiconductor element based on the fifth voltage and on a temperature coefficient relating to the fifth voltage, a step of measuring the exterior temperature of the semiconductor element after heat is generated, and a step of calculating the thermal resistance value of the semiconductor element based on the amount of change in the exterior temperature and the amount of change in the element temperature of the semiconductor element before and after heat is generated, and on the power.

Also, an aspect of the invention provides a thermal resistance measuring device with which the heretofore described thermal resistance measuring method is executed.

This kind of thermal resistance measuring method and thermal resistance measuring device are such that it is possible to measure thermal resistance with high accuracy.

DETAILED DESCRIPTION OF THE ILLUSTRATED EMBODIMENTS

Hereafter, embodiments will be described with reference to the drawings.

First Embodiment

A thermal resistance measuring method of a first embodiment is such that, firstly, the temperature is measured on the exterior of a semiconductor device housing a semiconductor element wherein current is caused to flow from a third electrode to a second electrode in accordance with voltage applied between a first electrode and the second electrode. Furthermore, a constant current of an extent such that the semiconductor element does not generate heat is input, a second voltage between the first electrode and second electrode is controlled so that a first voltage between the third electrode and second electrode of the semiconductor element is constant, and the element temperature of the semiconductor element is measured based on the temperature coefficient of the second voltage between the first electrode and second electrode.

Next, with a third voltage applied between first electrode and second electrode of the semiconductor element is kept constant, a constant current such that the semiconductor element generates heat is input into the third electrode, and a power between the third electrode and second electrode when the semiconductor element generates heat is measured. Then, the thermal resistance value is calculated based on the amount of change in each of the exterior temperature and element temperature before and after the semiconductor element generates heat, and on the power.

A description will be given of this kind of thermal resistance measuring method, using FIG. 1 and FIGS. 2A, 2B, and 2C.

Figure 1:
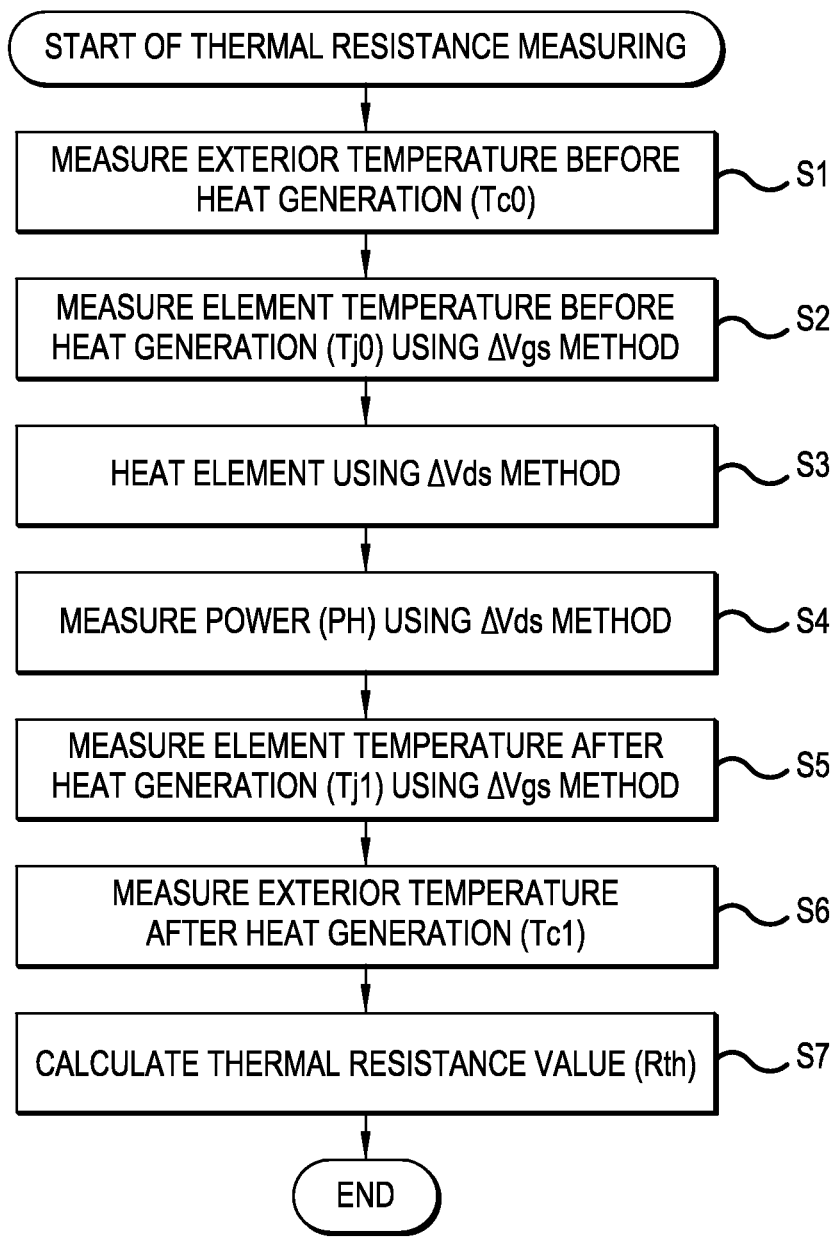
FIG. 1 is a flowchart showing a thermal resistance measuring method according to a first embodiment.

FIG. 1 is a flowchart showing the thermal resistance measuring method according to the first embodiment.

Figure 2:
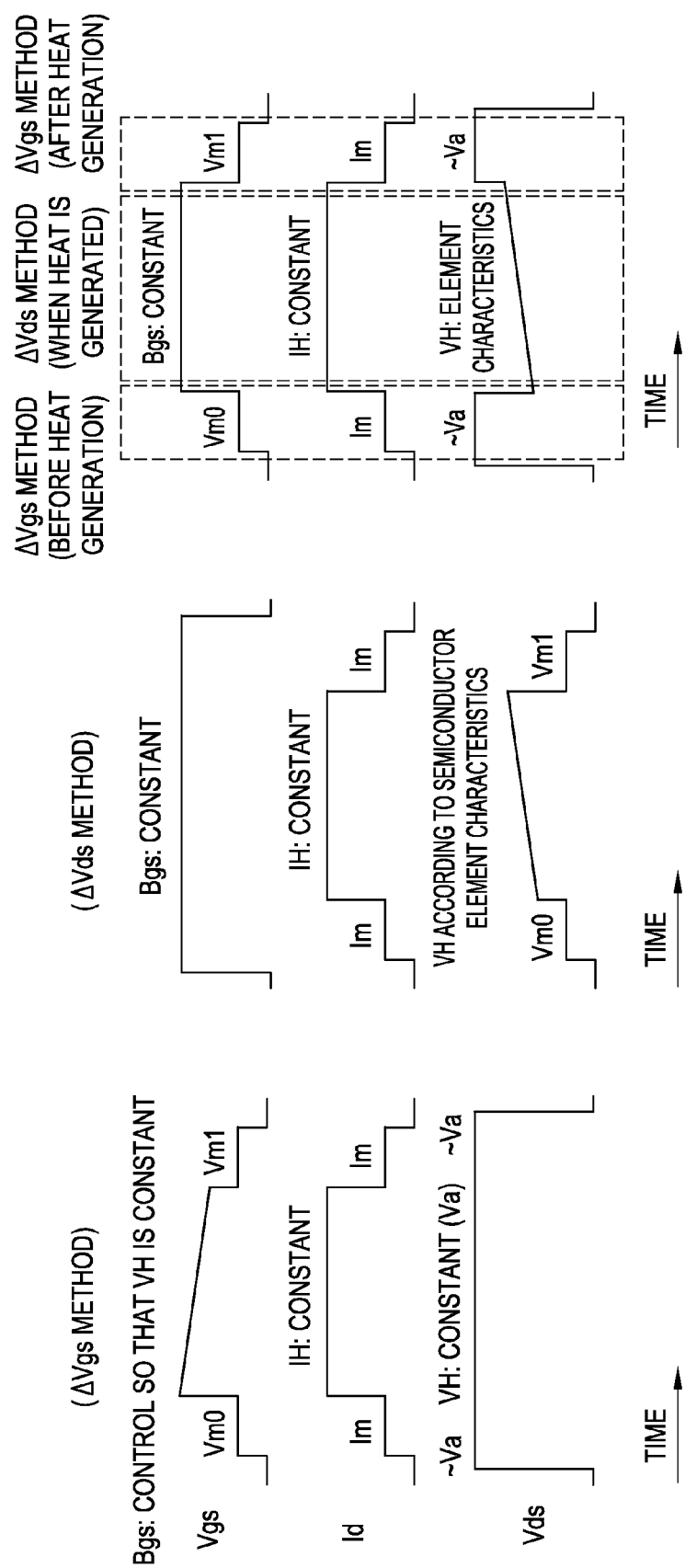
FIG. 2A, FIG. 2B, and FIG. 2C are diagrams showing voltage and current that change in accordance with time according to the first embodiment.

FIGS. 2A, 2B, and 2C are diagrams showing voltage and current that change in accordance with time according to the first embodiment, wherein FIG. 2A shows a ΔVgs method, FIG. 2B a ΔVds method, and FIG. 2C a case utilizing the thermal resistance measuring method according to the first embodiment. Also, in FIGS. 2A to 2C, Vgs represents the temporal change of voltage between gate and source electrodes, Id the temporal change of a drain current, and Vds the temporal change of voltage between drain and source electrodes.

A semiconductor device that is the subject of thermal resistance value measuring houses a semiconductor element wherein current is caused to flow from a third electrode to a second electrode in accordance with voltage applied to a first electrode. When the semiconductor element is, for example, a MOSFET, it is possible for the first electrode to correspond to a gate electrode, the second electrode to a source electrode, and the third electrode to a drain electrode, while when the semiconductor element is an insulated gate bipolar transistor (IGBT), it is possible for the first electrode to correspond to a gate electrode, the second electrode to an emitter electrode, and the third electrode to a collector electrode.

Hereafter, the description will be given with a case wherein a MOSFET is utilized as the semiconductor element, but this is merely an example as embodiments of the invention may be applied to any applicable semiconductor device.

Firstly, using FIG. 2A, a description will be given of a thermal resistance measuring method when utilizing only the ΔVgs method in a semiconductor device housing this kind of semiconductor element.

With the ΔVgs method, the Vds between the drain and source electrodes of the semiconductor element is taken to be a constant (VH).

An exterior temperature (Tc0) of the semiconductor device in a condition in which the semiconductor element is not generating heat is measured. Measuring of the exterior temperature of the semiconductor device can be carried out using a thermocouple, an infrared camera, or the like.

A very small constant current (Im) of an extent such that the semiconductor element does not generate heat is input into the semiconductor element, the Vgs between the gate and source electrodes at the time is measured, and an element temperature (Tjo) of the semiconductor element is calculated based on the measured Vgs (=Vm0) and a temperature coefficient (K). The temperature coefficient (K) representing the rate of change of the Vgs with respect to the temperature change of the semiconductor element is measured and calculated in advance.

Next, by a constant Id (=IH) being input into the semiconductor element, the semiconductor element is caused to operate and generate heat. The Vgs is controlled so that the Vds is constant (Va), and power PH (=IH×Va) is calculated.

After the semiconductor element is caused to generate heat, an exterior temperature (Tc1) of the semiconductor device and, based on the temperature coefficient (K) (the Vgs at this time is Vm1), an element temperature (Tj1) of the semiconductor element are measured, with the Id input into the semiconductor element as the very small constant current (Im) again.

Herein, the thermal resistance value (Rth) can generally be calculated using the following Expression 1:

$$Rth(j-c) = \{\Delta Tj(=Tj1-Tj0) - \Delta Tc(=Tc1-Tc0)\}/PH \quad \text{(Expression 1)}$$

By inputting the exterior temperatures (Tc0 and Tc1), element temperatures (Tj0 and Tj1), and power (PH) measured above into Expression 1, it is possible to calculate the thermal resistance value (Rth) according to the ΔVgs method.

However, when using the ΔVgs method to measure the thermal resistance value of a semiconductor device including a semiconductor element, the temperature of a channel region through which a channel current flows rises more than that of other portions in a semiconductor element with particularly high channel resistance. Because of this, the temperature distribution within the semiconductor element becomes localized, and the temperature characteristics of the current when heat is generated become positive, because of which it is not possible to appropriately carry out thermal resistance measuring. Furthermore, when the temperature distribution within the semiconductor element becomes localized, the temperature of generated heat between semiconductor elements is unequal in a semiconductor device in which multiple semiconductor elements are disposed in parallel, and it is not possible to appropriately carry out thermal resistance measuring in this case either.

Next, using FIG. 2B, a description will be given of a thermal resistance measuring method when utilizing only the ΔVds method, in place of the ΔVgs method, in a semiconductor device housing this kind of semiconductor element.

With the ΔVds method, the Vgs between the gate and source electrodes of the semiconductor element is taken to be a constant (Bgs).

With the ΔVds method, the exterior temperature (Tc0) of the semiconductor device is measured in a condition in which the semiconductor element is not generating heat, in the same way as with the ΔVgs method. Also, with the ΔVds method, the Vds between the source and drain electrodes is measured with respect to the very small constant current (Im) of an extent such that the semiconductor element does not generate heat, and the element temperature (Tjo) of the semiconductor element is measured based on the measured Vds (=Vm0) and the temperature coefficient (K). In this case, too, the temperature coefficient (K) is measured and calculated in advance.

Next, by the constant Id (=IH) being input into the semiconductor element, the semiconductor element is caused to operate and generate heat. The Vds (=VH), which changes in accordance with the characteristics of the semiconductor element at this time, is measured, and the power PH (=IH×VH) when the semiconductor element generates heat is calculated.

After the semiconductor element is caused to generate heat, the exterior temperature (Tc1) of the semiconductor device is measured, and the element temperature (Tj1) of the semiconductor element is calculated based on the measured Vds (=Vm1) and temperature coefficient (K), with the Id input into the semiconductor element as Im again.

With the ΔVds method, it is possible to calculate the thermal resistance value (Rth) by inputting the exterior temperatures, element temperatures, and power measured in this way into Expression 1.

However, when using the ΔVds method to measure the thermal resistance value (Rth) of a semiconductor element, the accuracy of the calculated temperature coefficient (K) is extremely poor in the case of a semiconductor element with particularly low on-state voltage. Because of this, it is not possible to appropriately carry out thermal resistance measuring based on the temperature coefficient (K).

Therefore, the thermal resistance measuring method according to the first embodiment is carried out using the procedure shown in FIG. 1 and the voltage and current shown in FIG. 2C.

Firstly, the exterior temperature (Tc0) of the semiconductor device housing the semiconductor element is measured before the semiconductor element generates heat (step S1).

A very small constant current (=Im) of an extent such that the semiconductor element does not generate heat is input, and the second voltage between the gate electrode (first electrode) and source electrode (second electrode) of the semiconductor element, controlled so that the first voltage between the drain electrode (third electrode) and source electrode (second electrode) of the semiconductor element is constant, is measured. The element temperature (Tj0) of the semiconductor element is calculated based on the second voltage and a temperature coefficient relating to the second voltage (step S2).

That is, in step S2, the element temperature (Tj0) of the semiconductor element is calculated using the ΔVgs method. It is taken that the temperature coefficient (K) representing the rate of change of the second voltage with respect to the temperature change at this time is calculated in advance.

The constant current (IH) such that the semiconductor element generates heat is input between the drain electrode (third electrode) and source electrode (second electrode), with the third voltage applied between the gate electrode (first electrode) and source electrode (second electrode) of the semiconductor element kept constant (step S3).

That is, in step S3, switching from the ΔVgs method, the semiconductor element is caused to generate heat by the semiconductor element being energized, using the ΔVds method.

In the semiconductor element that generates heat in this way, the power (PH=IH*VH) is measured based on the constant current (IH) such that the semiconductor element generates heat and on a fourth voltage (VH) between the drain electrode (third electrode) and source electrode (second electrode) when the semiconductor element generates heat (step S4).

After the power is measured, the current inputted to the drain electrode (third electrode) is returned from the current such that the semiconductor element generates heat to the very small constant current (Im) of an extent such that the semiconductor element does not generate heat, the element temperature (Tj1) is calculated using the ΔVgs method again, and the exterior temperature (Tc1) after the semiconductor element generates heat is measured (steps S5 and S6).

Lastly, it is possible to calculate the thermal resistance value (Rth) of the semiconductor device based on the amount of change in the exterior temperature (ΔTc=Tc1−Tc0) and amount of change in the element temperature (ΔTj=Tj1−Tj0) before and after the semiconductor element generates heat, and on the power (PH) (step S7).

This kind of thermal resistance measuring method is such that the element temperature of a semiconductor element wherein current is caused to flow from a third electrode to a second electrode in accordance with the voltage applied between a first electrode and second electrode is measured based on the temperature coefficient of voltage between the first electrode and second electrode when no heat is generated when inputting a constant current of an extent such that the semiconductor element does not generate heat. This kind of ΔVgs method is such that there is an increase in the accuracy of the temperature coefficient representing the amount of change in the voltage with respect to the temperature change when no heat is generated, and there is an increase in the accuracy of ΔTj obtained from the amount of change in the voltage when no heat is generated before and after the semiconductor element generates heat.

Also, this kind of thermal resistance measuring method is such that a constant current such that the semiconductor element generates heat is input between the third electrode and second electrode, with the voltage applied between the first electrode and second electrode of the semiconductor element kept constant, and the power is measured based on the current at which the semiconductor element generates heat and on the voltage between the third electrode and second electrode when heat is generated when the semiconductor element generates heat. When causing the semiconductor element to generate heat using this kind of ΔVds method, an increase in the temperature of a channel region, which is a cause of the temperature distribution becoming localized in the semiconductor element, is suppressed, the temperature changes over the whole of the inside of the semiconductor element, and it is thus no longer necessary to estimate the semiconductor element size on the small side. Also, it is possible to suppress variation in heat generation distribution in a semiconductor device in which multiple semiconductor elements are disposed in parallel.

Consequently, it is possible to measure the thermal resistance of a semiconductor device with high accuracy using the heretofore described thermal resistance measuring method. Also, as it is no longer necessary to add an unnecessary design margin, it is possible to carry out optimum design.

Second Embodiment

In a second embodiment, a more specific description will be given of the first embodiment.

Firstly, using FIG. 3, a description will be given of an example of a hardware configuration of a thermal resistance measuring device according to the second embodiment.

Figure 3:
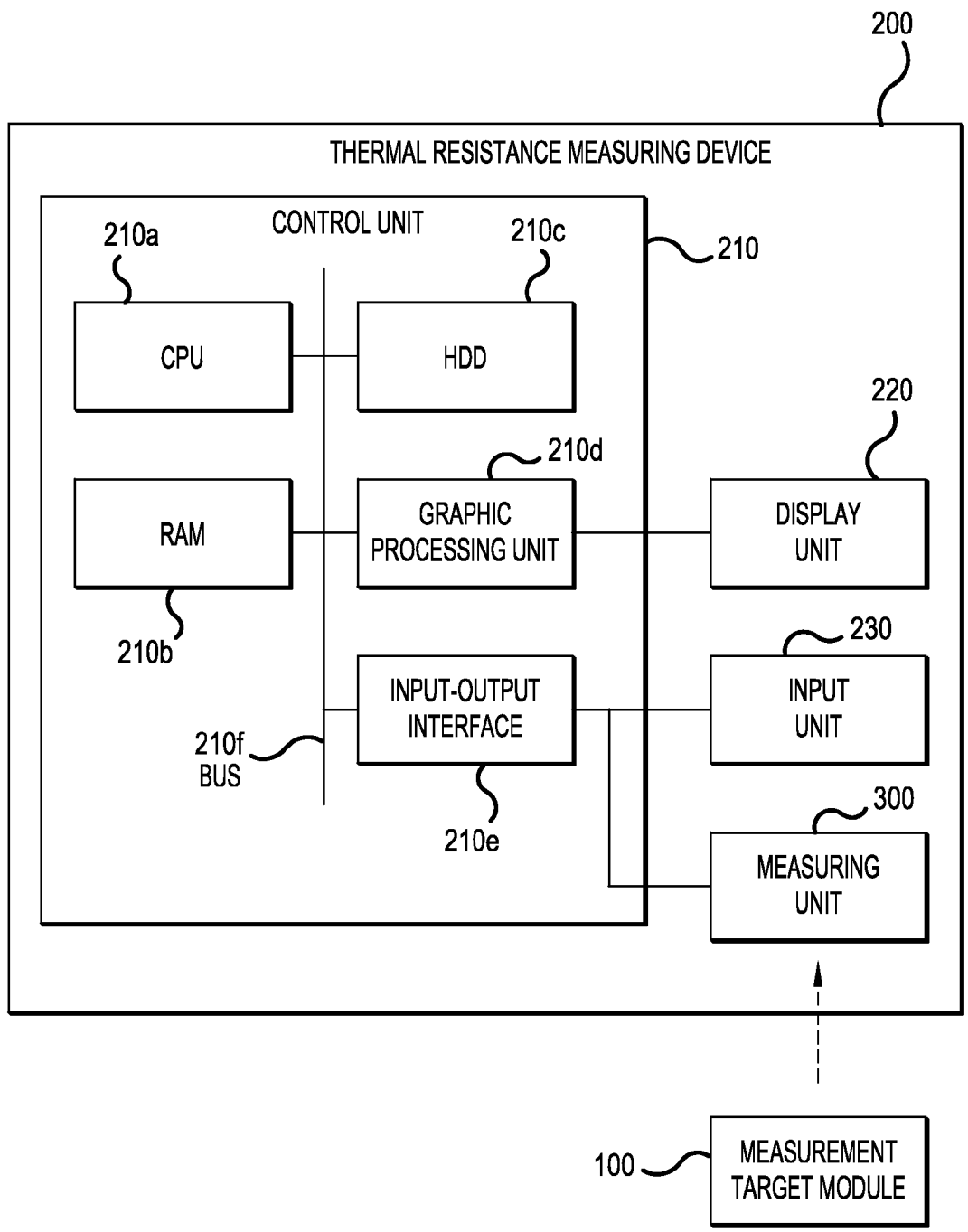
FIG. 3 is a diagram showing an example of a hardware configuration of a thermal resistance measuring device according to a second embodiment.

FIG. 3 is a diagram showing an example of a hardware configuration of a thermal resistance measuring device according to the second embodiment.

A thermal resistance measuring device 200 measures the thermal resistance value of a measurement target module 100, which is the subject of measuring.

The measurement target module 100 includes a switching element such as a MOSFET or IGBT, and is a module (semiconductor device) that is the subject of thermal resistance measuring. A description of a specific example of the measurement target module 100 will be given, using FIGS. 4A and 4B.

The thermal resistance measuring device 200 includes, for example, a control unit 210, a display unit 220, an input unit 230, and a measuring unit 300, as shown in FIG. 3.

The control unit 210 further includes a central processing unit (CPU) 210a, a random access memory (RAM) 210b, a hard disk drive (HDD) 210c, a graphic processing unit 210d, and an input-output interface 210e. These units are connected to each other by a bus 210f.

The CPU 210a centrally controls the whole of the computer by executing various kinds of programs stored in a storage medium, such as the HDD 210c.

The RAM 210b temporarily stores at least one portion of the programs executed by the CPU 210a, and various kinds of data necessary for processing by the programs.

The HDD 210c stores the programs executed by the CPU 210a, and various kinds of data and the like necessary for processing by the programs.

The display unit 220, to be described hereafter, is connected to the graphic processing unit 210d. The graphic processing unit 210d causes an image to be displayed on a display screen of the display unit 220 in accordance with a command from the CPU 210a.

The input unit 230 and measuring unit 300, to be described hereafter, are connected to the input-output interface 210e. The input-output interface 210e transmits an input signal from the input unit 230 to the CPU 210a via the bus 210f. Also, the input-output interface 210e notifies the measuring unit 300 via the bus 210f of a measuring control signal from the CPU 210a, thereby causing measuring of the measurement target module 100 to be executed. Also, the input-output interface 210e transmits a signal representing a measuring result from the measuring unit 300 to the CPU 210a via the bus 210f.

Also, the display unit 220 is a display device such as a display or monitor, and can display a result of measuring the thermal resistance value of the measurement target module 100, or the like, based on image information from the CPU 210a.

The input unit 230 is an input device such as a keyboard or mouse, receives input information, such as a setting of measuring conditions or a request for a process to be executed, in accordance with an operation input from a user, and notifies the CPU 210a thereof.

The measuring unit 300 includes units for measuring the element temperature of a semiconductor element, the exterior temperature of the measurement target module 100, and the like, which are used for measuring the thermal resistance value of the measurement target module 100. Details of the measuring unit 300 will be described using FIG. 5, to be described hereafter.

Next, using FIGS. 4A and 4B, a description will be given of details of the measurement target module 100.

Figure 4A:
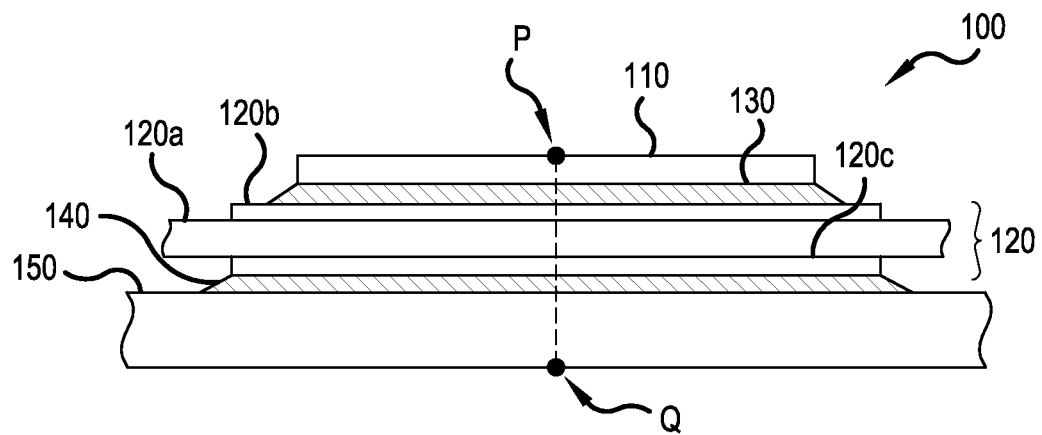
FIGS. 4A and 4B are diagrams showing a measurement target module according to the second embodiment.
Figure 4B:
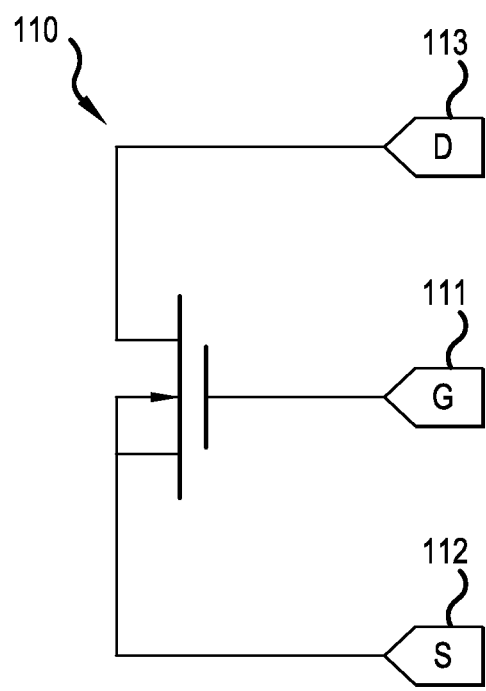

FIGS. 4A and 4B are diagrams showing the measurement target module according to the second embodiment.

FIG. 4A is a sectional schematic view of the measurement target module 100, while FIG. 4B shows a circuit configuration of a MOSFET 110 included in the measurement target module 100.

The measurement target module 100 is such that the MOSFET 110, including a gate terminal 111, source terminal 112, and drain terminal 113 connected to a gate electrode, source electrode, and drain electrode respectively (FIG. 4B), is disposed on a circuit substrate 120 across a solder layer 130.

The MOSFET 110 may include silicon carbide (or silicon), and the configuration thereof is such that a diode is incorporated therein.

The circuit substrate 120 may include an insulating substrate 120a and copper patterns 120b and 120c formed on the front and back surfaces of the insulating substrate 120a.

Furthermore, the measurement target module 100 is such that the circuit substrate 120 on which is disposed this kind of MOSFET 110 is disposed, via a solder layer 140, on a substrate 150, which is the exterior of the measurement target module 100 and includes, for example, copper.

This kind of measurement target module 100 is such that the element temperature of the MOSFET 110 at a point P on the front surface of the MOSFET 110 and the exterior temperature of the measurement target module 100 at a point Q on the back surface of the substrate 150 are measured.

Next, using FIG. 5, a description will be given of an example of functions included in the thermal resistance measuring device according to the second embodiment.

Figure 5:
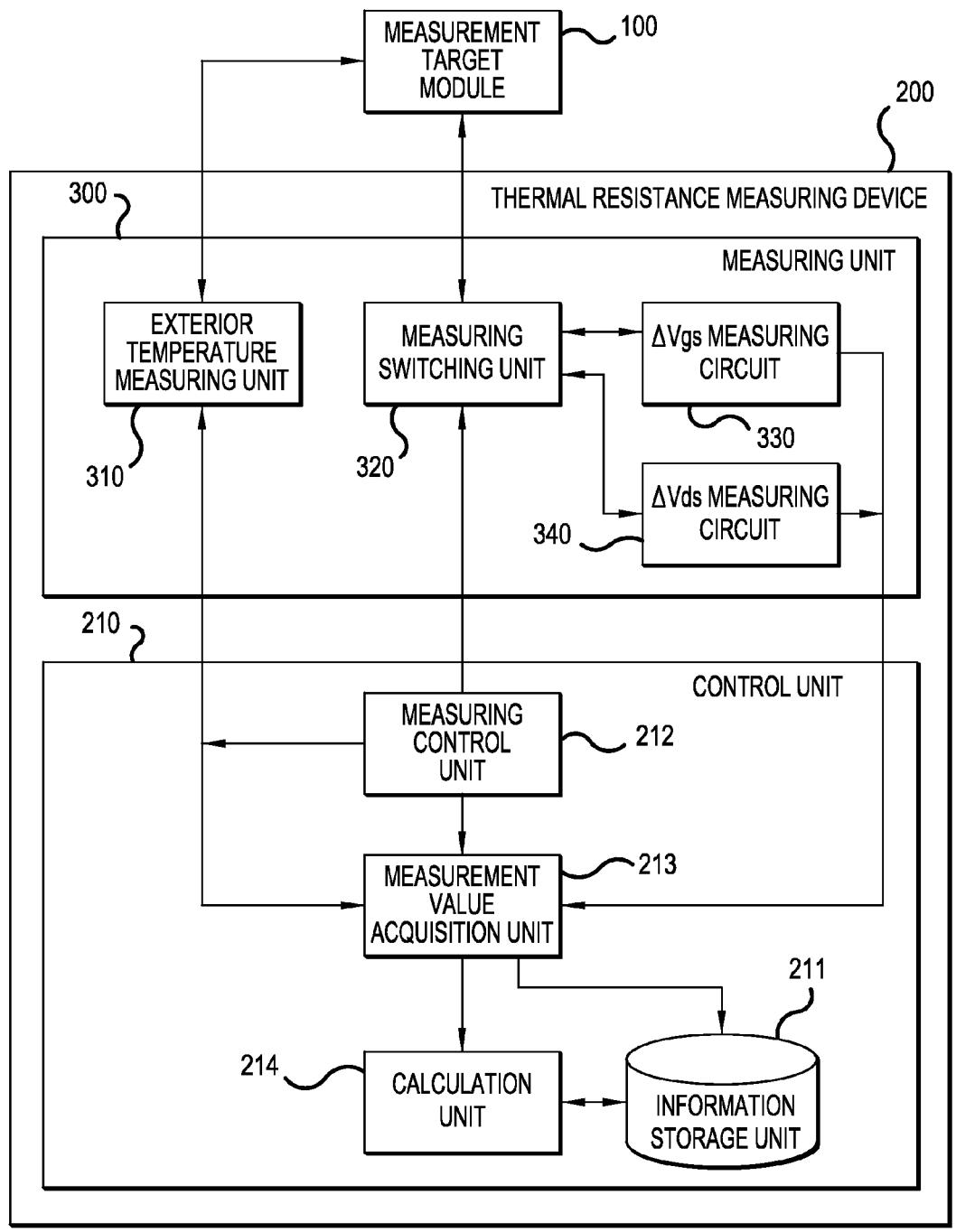
FIG. 5 is a diagram showing an example of a function block representing functions included in the thermal resistance measuring device according to the second embodiment.

FIG. 5 is a diagram showing an example of a function block representing functions included in the thermal resistance measuring device according to the second embodiment.

The control unit 210 included in the thermal resistance measuring device 200 includes at least an information storage unit 211, a measuring control unit 212, a measurement value acquisition unit 213, and a calculation unit 214.

The information storage unit 211 holds a measurement value of the measurement target module 100 measured by the measuring unit 300 and a calculation result calculated by the calculation unit 214, to be described hereafter. Also, the information storage unit 211 holds information on the temperature coefficient (K), which represents the rate of change of the voltage between the gate and source electrodes with respect to the temperature change of the MOSFET 110 of the measurement target module 100.

The measuring control unit 212 controls a measuring of the measurement target module 100 by the measuring unit 300. The measuring control unit 212 causes the measuring unit 300 to execute a measuring of the element temperature of the measurement target module 100 using the $\Delta V_{gs}$ method, and causes a current such that the MOSFET 110 generates heat to be input into the measurement target module 100, and the voltage and current at the time to be measured, using the $\Delta V_{ds}$ method. The measuring control unit 212 causes the measuring unit 300 to measure the exterior temperature of the measurement target module 100 using an exterior temperature measuring unit 310.

The measurement value acquisition unit 213 receives from the measuring unit 300 measurement values of the element temperature, exterior temperature, current, voltage, and the like, of the measurement target module 100 measured by the measuring unit 300, and causes the information storage unit 211 to hold the received measurement values.

The calculation unit 214, based on the measurement values held by the information storage unit 211, calculates the element temperature by dividing the voltage by the temperature coefficient, the power by multiplying the voltage with the current, and the thermal resistance value by dividing the difference between the amount of change in the element temperature and the amount of change in the exterior temperature by the power.

The processing functions of at least the measuring control unit 212, measurement value acquisition unit 213, and calculation unit 214 of the control unit 210 are realized by, for example, predetermined programs being executed by the CPU 210a included in the control unit 210, or by being configured of circuits, devices, or the like, that execute the processes.

Also, the measuring unit 300 includes the exterior temperature measuring unit 310, a measuring switching circuit 320, a ΔVgs measuring circuit 330 (first measuring unit), and a ΔVds measuring circuit 340 (second measuring unit).

The exterior temperature measuring unit 310 is a temperature measuring device, such as a thermocouple or an infrared camera, that measures the temperature of the Q point (refer to FIG. 4A) of the measurement target module 100.

The measuring switching circuit 320 is configured of a circuit in which an arbitrary element or the like is used and, based on a control signal from the measuring control unit 212, causes measuring to be executed by switching connection to the measurement target module 100 to the ΔVgs measuring circuit 330 or ΔVds measuring circuit 340.

The ΔVgs measuring circuit 330 is configured of a circuit in which an arbitrary element or the like is used, and measures the voltage between the gate and source electrodes of the MOSFET 110 of the measurement target module 100 using the ΔVgs method.

The ΔVds measuring circuit 340 is configured of a circuit in which an arbitrary element or the like is used, causes a current such that the MOSFET 110 of the measurement target module 100 generates heat to be input into the MOSFET 110, and measures the voltage and current of the MOSFET 110 at the time, using the ΔVds method.

Next, referring to FIGS. 6A and 6B, a description will be given of circuit configurations of the ΔVgs measuring circuit 330 and ΔVds measuring circuit 340.

Figure 6A:
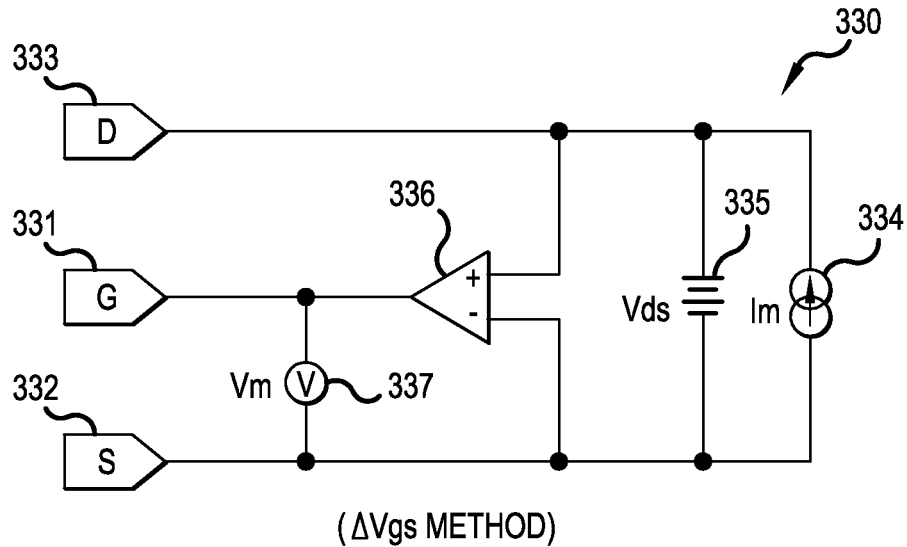
FIGS. 6A and 6B are diagrams showing examples of configurations of measuring circuits according to the second embodiment that carry out a ΔVgs method and ΔVds method respectively.
Figure 6B:
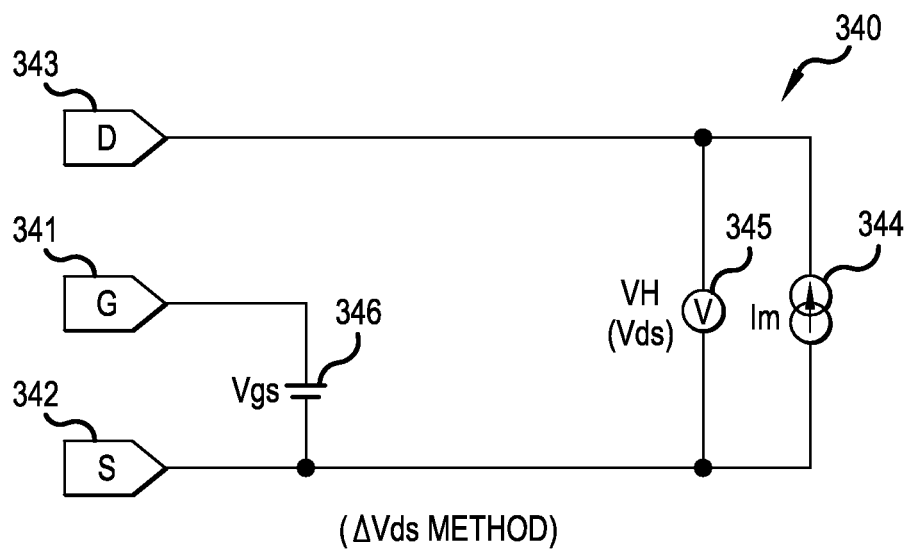

FIGS. 6A and 6B are diagrams showing examples of configurations of measuring circuits according to the second embodiment that carry out the ΔVgs method and ΔVds method, respectively. These are merely examples of circuits that may be used, as other configurations are possible.

FIG. 6A shows the ΔVgs measuring circuit 330, which measures using the ΔVgs method, while FIG. 6B shows the ΔVds measuring circuit 340, which measures using the ΔVds method.

The ΔVgs measuring circuit 330 includes a gate terminal 331, source terminal 332, and drain terminal 333, connected to the gate terminal 111, source terminal 112, and drain terminal 113 (refer to FIG. 4B), respectively, of the MOSFET 110, as shown in FIG. 6A.

The ΔVgs measuring circuit 330 includes, between the source terminal 332 and drain terminal 333, a constant current supply 334, which supplies current to the MOSFET 110 between the source electrode and drain electrode of the MOSFET 110, and a power supply 335 for applying a constant voltage.

Also, the ΔVgs measuring circuit 330 includes, between the source terminal 332 and drain terminal 333, a comparator 336 that applies voltage to the gate terminal 331 in response to signals from the source electrode and drain electrode of the MOSFET 110 so that the voltage to the gate electrode is of a predetermined value.

Furthermore, the ΔVgs measuring circuit 330 includes, between the gate terminal 331 and source terminal 332, a voltmeter 337 that measures the voltage between the gate electrode and source electrode of the MOSFET 110.

Referring to FIG. 6B, the ΔVds measuring circuit 340 includes a gate terminal 341, source terminal 342, and drain terminal 343, connected to the gate terminal 111, source terminal 112, and drain terminal 113, respectively, of the MOSFET 110.

The ΔVds measuring circuit 340 includes, between the drain terminal 343 and source terminal 342, a constant current supply 344, which supplies current for causing the MOSFET 110 to generate heat between the drain electrode and source electrode of the MOSFET 110, and a voltmeter 345 that measures the voltage between the drain electrode and source electrode of the MOSFET 110.

Furthermore, the ΔVds measuring circuit 340 includes, between the gate terminal 341 and source terminal 342, a power supply 346 for applying a constant voltage between the gate electrode and source electrode of the MOSFET 110.

Next, referring to FIG. 7, a description will be given of a method of measuring the thermal resistance of the measurement target module 100 executed by the thermal resistance measuring device 200 including this kind of configuration.

Figure 7:
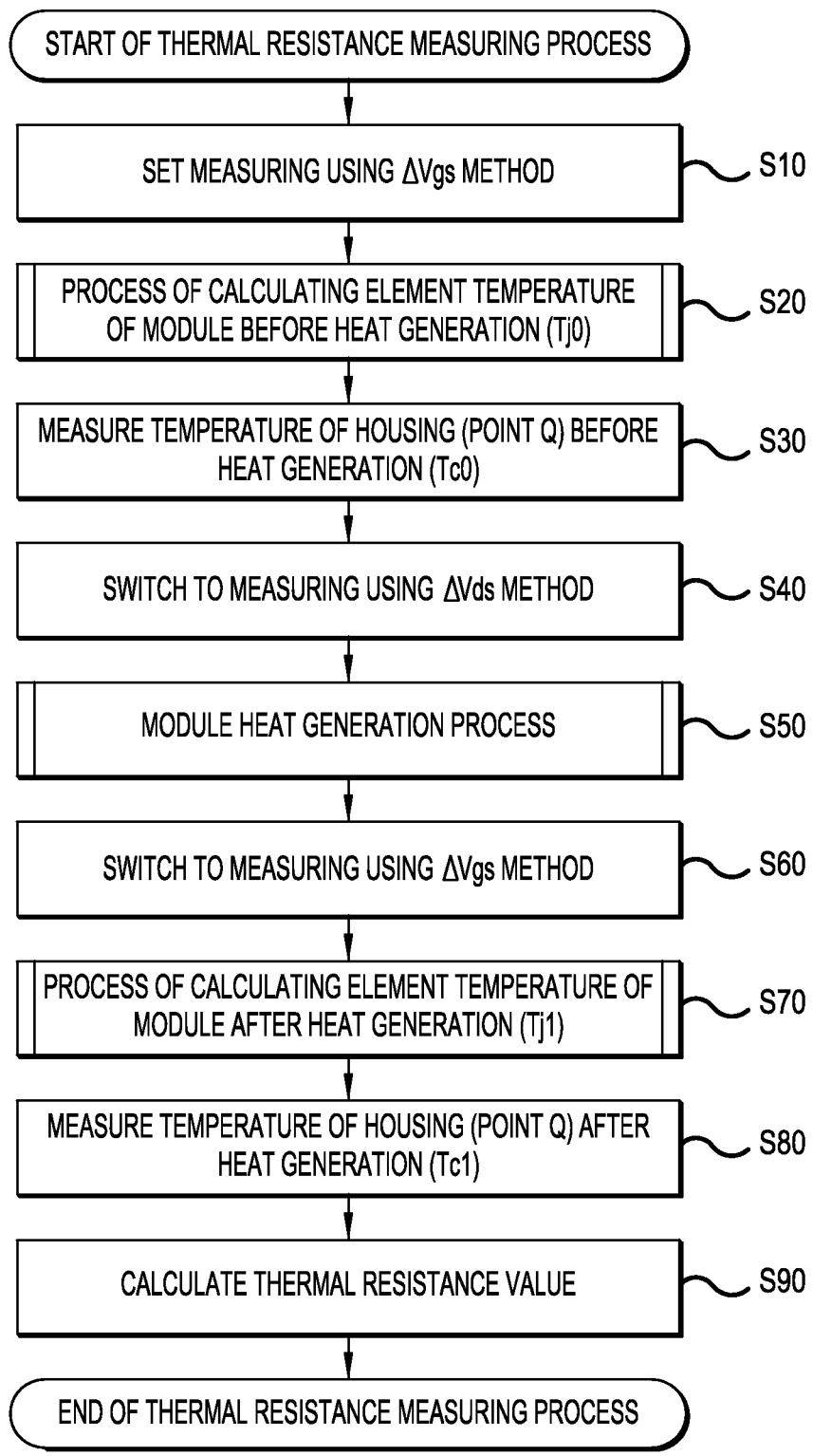
FIG. 7 is a flowchart showing a thermal resistance measuring process executed by the thermal resistance measuring device according to the second embodiment.

FIG. 7 is a flowchart showing a thermal resistance measuring process executed by the thermal resistance measuring device according to the second embodiment.

The temperature coefficient (K) is calculated in advance before the process of the flowchart shown in FIG. 7 is executed. This kind of temperature coefficient (K) is calculated, for example, as described below.

The ΔVgs measuring circuit 330 applies voltage so that the voltage (Vds) between the source and drain electrodes of the MOSFET 110 becomes 20V, and causes a constant current Im (for example, 100 mA) of an extent such that the MOSFET 110 does not generate heat to be input (refer to FIG. 6A).

In this kind of situation, the ΔVgs measuring circuit 330 causes the voltage (Vgs) between the gate and source electrodes to change, and measures the voltage (Vgs) with respect to the corresponding temperature. The description of the temperature measuring device is omitted from FIG. 6A. The measurement value acquisition unit 213 acquires information on the temperature corresponding to each voltage (Vgs) from the ΔVgs measuring circuit 330, and causes each item of information to be held in the information storage unit 211. The calculation unit 214 can calculate the temperature coefficient (K) by dividing the amount of change in the voltage (Vgs) by the amount of change in the temperature, based on this kind of information on the voltage (Vgs) and temperature corresponding to the voltage (Vgs) held by the information storage unit 211. This kind of temperature coefficient (K) is held by the information storage unit 211.

The thermal resistance measuring device 200 wherein this kind of advance preparation is completed, with the measurement target module 100 set in a predetermined position, receives a measuring start operation input with respect to the input unit 230 from the user. Then, the thermal resistance measuring device 200 is such that the control unit 210 executes an initial setting, such as clearing as appropriate information held by the information storage unit 211, and starts the process described below.

In step S10, the measuring control unit 212 of the control unit 210 notifies the measuring switching circuit 320 of a signal requesting measuring using the ΔVgs method.

The measuring switching circuit 320, on being notified of this kind of signal, connects the ΔVgs measuring circuit 330

(FIG. 6A) to the measurement target module 100, and sets measuring using the ΔVgs method.

In step S20, the calculation unit 214 of the control unit 210 calculates the temperature (Tj0) at the point P of the MOSFET 110, based on the voltage (Vgs=Vm0) between the gate and source electrodes of the MOSFET 110 measured by the ΔVgs measuring circuit 330 and on the temperature coefficient (K).

The calculation unit 214 of the control unit 210 causes the calculated temperature (Tj0) to be held in the information storage unit 211.

Also, details of the process of step S20 will be described hereafter.

In step S30, the measuring control unit 212 of the control unit 210 notifies the exterior temperature measuring unit 310 of a request to measure the temperature (Tc0) at the point Q of the measurement target module 100.

The exterior temperature measuring unit 310 measures the temperature (Tc0) at the point Q of the measurement target module 100, and notifies the measurement value acquisition unit 213 of the control unit 210 of the measured temperature (Tc0).

The measurement value acquisition unit 213 causes the information storage unit 211 to hold information on the temperature (Tc0) of which the measurement value acquisition unit 213 has been notified. The process of step 30 may be carried out at any time, provided that it is before step S40, to be described hereafter.

In step S40, the measuring control unit 212 of the control unit 210 notifies the measuring switching circuit 320 of a signal requesting measuring using the ΔVds method.

The measuring switching circuit 320, on being notified of this kind of signal, switches the connection to the measurement target module 100 from the ΔVgs measuring circuit 330 to the ΔVds measuring circuit 340 (FIG. 6B).

In step S50, the ΔVds measuring circuit 340 applies 20V as the voltage (Vgs) between the gate and source electrodes of the MOSFET 110, and causes a constant current (IH=100 A) to be input into the MOSFET 110, thus causing the MOSFET 110 to generate heat.

At this time, the calculation unit 214 of the control unit 210 calculates the power (PH) based on the constant current and on the voltage (Vds) between the drain and source electrodes of the MOSFET 110 measured by the ΔVds measuring circuit 340.

Details of the process of step S50 will be described hereafter.

In step S60, the measuring control unit 212 of the control unit 210 notifies the measuring switching circuit 320 of a signal requesting measuring using the ΔVgs method.

The measuring switching circuit 320, on being notified of this kind of signal, switches the connection to the measurement target module 100 from the ΔVds measuring circuit 340 to the ΔVgs measuring circuit 330 (FIG. 6A).

In step S70, in the same way as in step S20, the calculation unit 214 of the control unit 210 calculates the temperature (Tj1) at the point P of the MOSFET 110, based on the voltage (Vgs=Vm1) between the gate and source electrodes of the MOSFET 110 measured by the ΔVgs measuring circuit 330 after heat is generated, and on the temperature coefficient (K).

The calculation unit 214 of the control unit 210 causes the calculated temperature (Tj1) to be held in the information storage unit 211.

Also, details of the process of step S70 will be described hereafter.

In step S80, in the same way as in step S30, the measuring control unit 212 of the control unit 210 notifies the exterior temperature measuring unit 310 of a request to measure the temperature (Tc1) at the point Q of the measurement target module 100, including the MOSFET 110, after heat is generated.

The exterior temperature measuring unit 310 measures the temperature (Tc1) at the point Q of the measurement target module 100, and notifies the measurement value acquisition unit 213 of the control unit 210 of the measured temperature (Tc1). The measurement value acquisition unit 213 causes the information storage unit 211 to hold information on the temperature (Tc1) of which the measurement value acquisition unit 213 has been notified.

The process of step S80 should be executed as soon as possible, for example, within 100 μs, after the process of step S50 ends. In step S90, the calculation unit 214 of the control unit 210, referring to the information storage unit 211, inputs the element temperatures (Tj0 and Tj1) and exterior temperatures (Tc0 and Tc1) measured and calculated in steps S20, S70, S30, and S80, and the power (PH), into Expression 1, and calculates the thermal resistance value (Rth).

The calculation unit 214 causes the information storage unit 211 to hold information on the calculated thermal resistance value (Rth). By executing the processes in accordance with the heretofore described flowchart, it is possible to calculate the thermal resistance value (Rth) of the measurement target module 100 including the MOSFET 110.

Figure 8A:
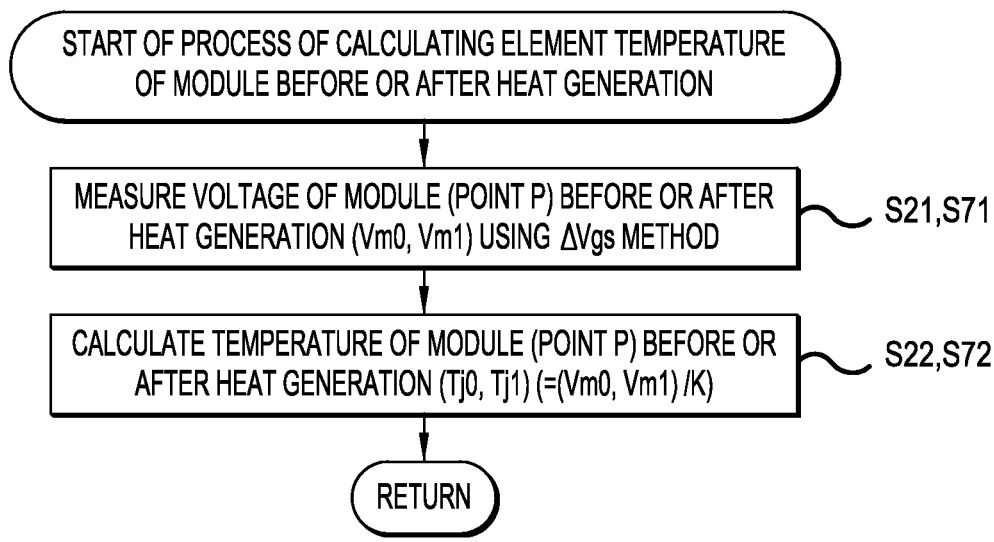
FIGS. 8A and 8B are flowcharts showing details of the thermal resistance measuring process executed by the thermal resistance measuring device according to the second embodiment.
Figure 8B:
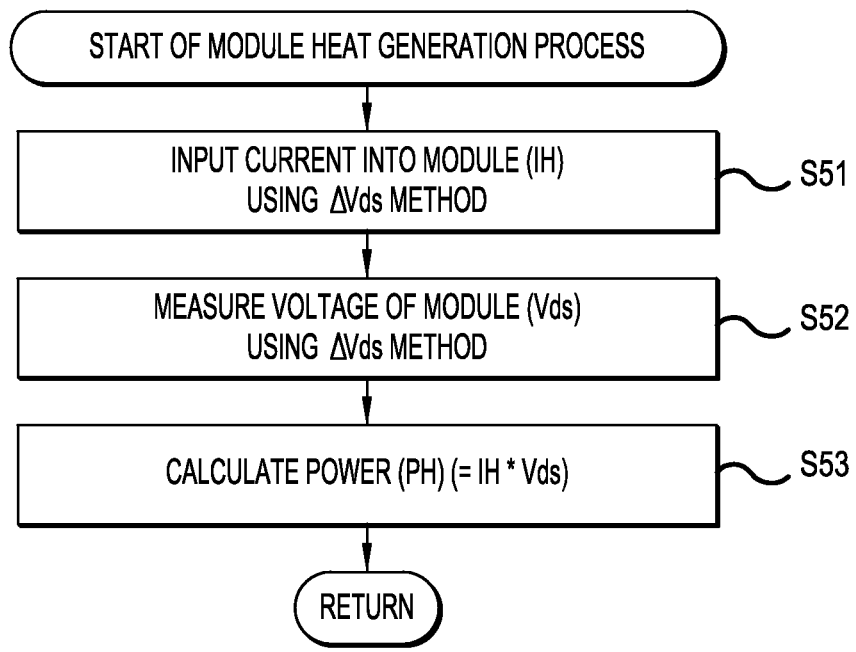

Next, referring to FIGS. 8A and 8B, a description will be given of details of the processes executed in steps S20, S50, and S70 of the heretofore described flowchart. FIGS. 8A and 8B are flowcharts showing details of the thermal resistance measuring process executed by the thermal resistance measuring device according to the second embodiment.

FIG. 8A shows a flowchart of step S20 (the process of calculating the element temperature of the module before heat generation) and step S70 (the process of calculating the element temperature of the module after heat generation), while FIG. 8B shows a flowchart of step S50 (the module heat generating process). Also, as the same process is executed in steps S20 and S70, steps S20 and S70 are shown together in FIG. 8A.

Firstly, a description will be given of the process of steps S20 and S70. In steps S21 and S71, the ΔVgs measuring circuit 330 measures the voltage (Vgs=Vm0, Vm1) between the gate and source electrodes of the MOSFET 110.

The ΔVgs measuring circuit 330 notifies the measurement value acquisition unit 213 of the control unit 210 of the measured voltage (Vgs=Vm0, Vm1). The measurement value acquisition unit 213 causes the information storage unit 211 to hold the voltage (Vgs=Vm0, Vm1) of which the measurement value acquisition unit 213 has been notified.

In steps S22 and S72, the calculation unit 214 of the control unit 210, referring to the information storage unit 211, calculates the temperature (Tj0, Tj1) at the point P of the MOSFET 110 by dividing the voltage (Vgs=Vm0, Vm1) by the temperature coefficient (K).

The calculation unit 214 causes the information storage unit 211 to hold information on the calculated temperature (Tj0, Tj1). In steps S20 and S70, by executing the processes in accordance with the heretofore described flowchart, it is possible to calculate the temperatures (Tj0, Tj1) at the point P of the MOSFET 110 before and after heat generation.

Next, a description will be given of the process of step S50. In step S51, the ΔVds measuring circuit 340 applies 20V as the voltage (Vgs) between the gate and source electrodes of the MOSFET 110, and causes a constant current (IH=100 A) to be input into the MOSFET 110, thus causing the MOSFET 110 to operate and generate heat.

The ΔVds measuring circuit 340 notifies the measurement value acquisition unit 213 of the control unit 210 of information on the current (IH=100 A). The measurement value acquisition unit 213 causes the information storage unit 211 to hold the current (IH=100 A) of which the measurement value acquisition unit 213 has been notified.

In step S52, the ΔVds measuring circuit 340 measures the voltage (Vds) between the drain and source electrodes at the time. The ΔVds measuring circuit 340 notifies the measurement value acquisition unit 213 of the control unit 210 of the measured voltage (Vds).

The measurement value acquisition unit 213 causes the information storage unit 211 to hold the voltage (Vds) of which the measurement value acquisition unit 213 has been notified. In step S53, the calculation unit 214 of the control unit 210, referring to the information storage unit 211, calculates the power (PH) between the drain and source electrodes in accordance with the product of the current (IH=100 A) and the voltage (Vds).

The calculation unit 214 uses either the average value of the voltage (Vds) while the current (IH=100 A) is being input into the MOSFET 110 or the voltage (Vds) at the point at which half of the input time elapses as the voltage (Vds) used when calculating the power (PH).

The calculation unit 214 causes the information storage unit 211 to hold the calculated power (PH). In step S50, by executing the process in accordance with the heretofore described flowchart, it is possible to calculate the power (PH) between the source and drain electrodes of the MOSFET 110 when heat is generated.

The thermal resistance measuring method executed with this kind of thermal resistance measuring device 200 is such that the element temperature (Tj0, Tj1) of the MOSFET 110 is calculated based on the temperature coefficient (K) of the voltage (Vgs) between the gate and source electrodes. In particular, as the on-state voltage is extremely low when the MOSFET 110 is configured of silicon carbide or gallium nitride, the accuracy of the temperature coefficient (K) calculated using the ΔVds method is extremely poor. Therefore, the thermal resistance measuring device 200 is such that, by utilizing this kind of ΔVgs method, there is an increase in the accuracy of the temperature coefficient (K) representing the rate of change of the voltage with respect to the temperature change (ΔTj=Tj1−Tj0).

Also, the thermal resistance measuring method executed with this kind of thermal resistance measuring device 200 is such that a current such that the MOSFET 110 generates heat is input between the drain and source electrodes, with the voltage applied to the gate electrode of the MOSFET 110 kept constant, and the power (PH) is measured based on the current (IH) such that the MOSFET 110 generates heat and on the voltage (Vds) between the drain and source electrodes when the MOSFET 110 generates heat. In particular, as the channel resistance is high when the MOSFET 110 is composed of silicon carbide or gallium nitride, the heat generation distribution within the MOSFET 110 becomes localized when generating heat using the ΔVgs method, and furthermore, the temperature of generated heat between the MOSFETs 110 is unequal in the measurement target module 100 in which multiple MOSFETs 110 are disposed in parallel, and it is therefore not possible to appropriately carry out thermal resistance measuring. Therefore, the thermal resistance measuring device 200 is such that, when causing the MOSFET 110 to generate heat using this kind of ΔVds method, an increase in the temperature of a channel region, which is a cause of the temperature distribution becoming localized in the MOSFET 110, is suppressed, as the temperature changes over the whole of the inside of the MOSFET 110, and it is thus no longer necessary to estimate the MOSFET 110 size on the small side. Furthermore, it is possible to suppress variation in heat generation distribution in the MOSFETs 110 in the measurement target module 100 in which multiple MOSFETs 110 are disposed in parallel.

Consequently, it is possible to measure the thermal resistance of the measurement target module 100 with high accuracy using the thermal resistance measuring method executed with the thermal resistance measuring device 200. Also, it is no longer necessary to add an unnecessary design margin when multiple MOSFETs 110 are disposed in parallel in the measurement target module 100, and it is thus possible to carry out optimum design.

What is claimed is:

1. A thermal resistance measuring method, comprising:
   measuring an exterior temperature of a semiconductor device housing a semiconductor element wherein current is caused to flow from a third electrode of the semiconductor element to a second electrode of the semiconductor element in accordance with a voltage applied between a first electrode of the semiconductor element and the second electrode;
   inputting a constant current such that the semiconductor element does not generate heat, measuring a second voltage between the first electrode and second electrode, which is controlled so that a first voltage between the third electrode and second electrode is constant, and calculating the element temperature of the semiconductor element based on the second voltage and on a temperature coefficient relating to the second voltage;
   causing a constant current such that the semiconductor element generates heat to be input between the third electrode and second electrode, with a third voltage applied between the first electrode and second electrode kept constant;
   calculating a power based on the current such that the semiconductor element generates heat, and on a fourth voltage between the third electrode and second electrode when the semiconductor element generates heat;
   inputting a constant current of an extent such that the semiconductor element does not generate heat, measuring a fifth voltage between the first electrode and second electrode, which is controlled so that the first voltage between the third electrode and second electrode is constant, and calculating the element temperature of the semiconductor element based on the fifth voltage and on a temperature coefficient relating to the fifth voltage;
   measuring the exterior temperature of the semiconductor element after heat is generated; and
   calculating a thermal resistance value of the semiconductor element based on the amount of change in the exterior temperature and the amount of change in the element temperature of the semiconductor element before and after heat is generated, and on the power.

2. The thermal resistance measuring method according to claim 1, wherein
   the semiconductor element is a field-effect transistor or an insulated gate bipolar transistor.

3. The thermal resistance measuring method according to claim 1, wherein
   the semiconductor element comprises silicon carbide or gallium nitride.

4. The thermal resistance measuring method according to claim 1, wherein
calculating the element temperature of the semiconductor element based on the second voltage and on the temperature coefficient relating to the second voltage comprises dividing the measured second voltage by the temperature coefficient.

5. The thermal resistance measuring method according to claim 1, wherein
the exterior temperature of the semiconductor device is measured at a back surface of the semiconductor element.

6. The thermal resistance measuring method according to claim 5, wherein
the exterior temperature of the semiconductor device is measured using a thermocouple or an infrared camera.

7. The thermal resistance measuring method according to claim 1, wherein
the power is calculated from the product of the current causing the semiconductor element to generate heat and the fourth voltage.

8. The thermal resistance measuring method according to claim 7, wherein
the fourth voltage is the average voltage from the start of inputting to the end of inputting the current causing the semiconductor element to generate heat between the third electrode and second electrode.

9. The thermal resistance measuring method according to claim 7, wherein
the fourth voltage is the voltage at the point at which half of the time of inputting the current causing the semiconductor element to generate heat between the third electrode and second electrode elapses.

10. The thermal resistance measuring method according to claim 1, wherein
the thermal resistance value is calculated by dividing the difference between the amount of change in the exterior temperature and the amount of change in the element temperature, before and after the semiconductor element generates heat, by the power.

11. A thermal resistance measuring device, comprising:
an exterior temperature measuring unit configured to measure an exterior temperature of a semiconductor device housing a semiconductor element, before and after a generation of heat by the semiconductor element in response to current caused to flow from a third electrode of the semiconductor element to a second electrode of the semiconductor element in accordance with a voltage applied between a first electrode of the semiconductor element and the second electrode;
a first measuring unit configured to measure a voltage between the first electrode and second electrode when no heat is generated, before and after the semiconductor element generates heat, and to cause a constant current of an extent such that the semiconductor element does not generate heat to be input, which is controlled so that voltage between the third electrode and second electrode is constant;
a second measuring unit configured to measure a voltage between the third electrode and second electrode when heat is generated, to cause a constant current such that the semiconductor element generates heat to be input between the third electrode and second electrode, with a voltage applied between the first electrode and second electrode kept constant; and
a calculation unit configured to calculate an element temperature of the semiconductor element based on the voltage when no heat is generated and on a temperature coefficient relating to the voltage when no heat is generated, to calculate a power based on the current such that the semiconductor element generates heat and on the voltage when heat is generated, and to calculate a thermal resistance value of the semiconductor element based on the amount of change in the exterior temperature and the amount of change in the element temperature of the semiconductor element before and after heat is generated, and on the power.

* * * * *